United States Patent [19]

Marcantonio et al.

[11] Patent Number: 6,006,170
[45] Date of Patent: *Dec. 21, 1999

[54] METHOD AND SYSTEM FOR ASCERTAINING ANOMALIES IN ELECTRIC MOTORS

[75] Inventors: Angelo R. Marcantonio; Stephen J. Hanson, both of Princeton; Thomas Petsche, Neshanic Station, all of N.J.

[73] Assignee: Siemens Corporate Research, Inc., Princeton, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/937,197

[22] Filed: Sep. 25, 1997

Related U.S. Application Data

[63] Continuation of application No. 08/674,645, Jun. 28, 1996, abandoned.

[51] Int. Cl.$^6$ ................................................ G01R 23/00
[52] U.S. Cl. ........................... 702/182; 702/185; 702/34; 702/77; 324/772; 364/528.28; 318/806; 361/23; 706/14
[58] Field of Search ................................ 702/33, 34, 77, 702/182, 183, 185; 364/528.27, 528.28, 528.29; 340/679, 682; 318/806, 635, 434; 361/23–25, 30, 31; 324/772, 545, 522, 512; 706/20, 21, 14–16, 45, 62, 902–907, 912–915

[56] References Cited

U.S. PATENT DOCUMENTS

| | | | |
|---|---|---|---|
| 5,003,490 | 3/1991 | Castelaz et al. ........................... | 395/22 |
| 5,270,640 | 12/1993 | Kohler et al. .............................. | 324/772 |
| 5,359,699 | 10/1994 | Tong et al. ................................. | 395/22 |
| 5,566,092 | 10/1996 | Wang et al. ........................ | 364/551.02 |
| 5,570,256 | 10/1996 | Schoen et al. .............................. | 361/31 |
| 5,574,387 | 11/1996 | Petsche et al. ........................... | 324/772 |
| 5,576,632 | 11/1996 | Petsche et al. ........................... | 324/772 |
| 5,598,081 | 1/1997 | Okamura et al. ........................ | 318/801 |
| 5,629,870 | 5/1997 | Farag et al. ......................... | 364/528.21 |
| 5,640,103 | 6/1997 | Petsche et al. ........................... | 324/772 |
| 5,675,497 | 10/1997 | Petsche et al. ........................... | 702/182 |
| 5,726,905 | 3/1998 | Yazici et al. ............................... | 702/38 |
| 5,742,522 | 4/1998 | Yazici et al. .......................... | 324/76.11 |

OTHER PUBLICATIONS

"Condition Monitoring of Electrical Machines", Tavner et al., Research Studies Press Ltd., Letchworth Hertfordshire, England, pp. 176–227.

"Signature Frequency Analysis for Diagnosis of Induction Motor Systems", Ikuro Morita, Electrical Eng. in Japan, vol. 109, No. 4, 1989, pp. 102–112.

"Induction Motor Fault Detectoin Via Passive Current Monitoring", Kliman et al., International Conference on Electrical Machines, Aug. 1990, pp. 13–17.

(List continued on next page.)

*Primary Examiner*—James P. Trammell
*Assistant Examiner*—Tuan Q. Dam
*Attorney, Agent, or Firm*—Adel A. Ahmed

[57] ABSTRACT

A computer-based system and method for ascertaining anomalies in an electric motor, includes computing and processing a set of Fast Fourier Transforms (FFT's) of the supply current waveforms for a motor known to be in a normal condition to create a feature set of input vectors. The input vector assignments for all possible cluster groupings 1 through n are derived using Ward's method. The method includes computing the Approximate Weight of Evidence (AWE) for each cluster grouping then selecting that count associated with a maximum AWE and designating this count as s. For each cluster in each grouping 1 through s, the method finds the member vector farthest from the cluster's centroid and defines this as the cluster's radius. A single input sample for a motor under supervision is read in, following by computing and processing an FFT based on the input sample for a newly generated feature vector and then checking whether the newly generated feature vector is inside any of the clusters 1 through s as defined for each cluster by its respective radius, and if not, outputting a warning signal.

12 Claims, 7 Drawing Sheets

OTHER PUBLICATIONS

"The Classification and Mixture Maximum Likelihood Approaches to Cluster Analysis", G.J. McLachlan, Handbook of Statistics, vol. 2, North–Holland Publishing Company (1982), pp. 199–208.

"Statistical Modelling of Data on Teaching Styles", Aitkin et al., J.R. Statist. Soc. A (1981), 144, Par 4, pp. 419–461.

"Clustering of Large Data Sets", Prof. Jure Zupan, Research Studies Press, pp. 37–73.

"Finding Groups in Data, An Introduction to Cluster Analysis", Kaufman et al., John Wiley & Sons, Inc., pp. 227–234.

"Cluster Analysis for Researchers", H. Charles Romesburg, Ph.D., Robert E. Krieger Publishing Co., Malabar, FL, 1990, pp. 128–135.

"Model–based Gaussian and non–Gaussian Clustering", Banfield et al., Biometrics, 1992, pp. 1–30.

"An Unsupervised, On–Line System for Induction Motor Fault detection using stator Current Monitoring" By R. Schoen et al, IEEE, 1994, pp. 103–109, vol. 1.

"Motor bearing damage detection using stator current monitoring" By R. Schoen et al, Ind. Appl., Jan. 1994 conference, pp. 110–116.

"Induction motor faults diagnostic via Artificial Neural Network" By Stefano et al, Ind. Elect., 1994 International Conference, pp. 220–225.

"The Industrial application of phase current analysis to detect rotor winding faults in squirrel cage induction motors" By David Rankin, Power Engr. Jour., pp. 77–84, Apr. 1995.

"Using a neural/fuzzy system to extract heuristic knowledge of incipient faults in induction motors:part II–appl." By Goode et al, IEEE Trans. on Ind. Elect., pp. 139–146, Apr. 1995.

FIG. 3

*WARD'S ALGORITHM CLUSTERING EXPERIMENT*

-INPUTS ARE FOR BALANCED MOTOR, 10 FFT's PER LOAD CONDITION
-EACH FFT IS AN AVERAGE OF 12 RAW FFT's
-THERE ARE 42 INPUT FEATURES IN THE RANGE OF 0Hz-58.59Hz
-EACH FEATURE IS AN AVERAGE OF 3 FREQUENCIES SPANNING 1.4063Hz
-VECTORS  1:10 1/2 RATED CONSTANT    11:20 RATED CONSTANT
-VECTORS 21:30 RATED SIN(Wr)         31:40 1/2 RATED SIN(Wr)
-VECTORS 41:50 RATED SIN(2Wr)        51:60 RATED SQR(Wr)
-VECTORS 61:70 RATED SIN(28Hz)       71:80 1/2 RATED SIN(28Hz)
-VECTORS 81:90 RATED SIN(30Hz)       91:100 RATED SQR(30Hz)
-APPROXIMATE WEIGHT OF EVIDENCE INDICATED 10 CLUSTERS
-NOTE THAT EACH CLUSTER CONSISTS OF PRECISELY A SINGLE LOAD CONDITION

| | | | | | | | | | | |
|---|---|---|---|---|---|---|---|---|---|---|
| <1>  | 1  | 3  | 2  | 4  | 5  | 6  | 7  | 8  | 10 | 9  |
| <2>  | 11 | 12 | 13 | 19 | 20 | 14 | 15 | 16 | 17 | 18 |
| <3>  | 21 | 30 | 26 | 28 | 22 | 23 | 24 | 25 | 27 | 29 |
| <4>  | 31 | 33 | 32 | 34 | 36 | 35 | 37 | 38 | 39 | 40 |
| <5>  | 41 | 45 | 47 | 46 | 48 | 42 | 43 | 44 | 49 | 50 |
| <6>  | 51 | 54 | 52 | 59 | 55 | 58 | 53 | 56 | 57 | 60 |
| <7>  | 61 | 62 | 63 | 64 | 66 | 67 | 65 | 70 | 68 | 69 |
| <8>  | 71 | 79 | 80 | 73 | 76 | 77 | 72 | 78 | 74 | 75 |
| <9>  | 81 | 83 | 82 | 87 | 85 | 88 | 86 | 84 | 89 | 90 |
| <10> | 91 | 92 | 93 | 94 | 99 | 100| 95 | 96 | 98 | 97 |

FIG. 4

| | |
|---|---|
| 21.95 | 25.68 |
| 23.16 | 25.64 |
| 23.83 | 26.31 |
| 22.89 | 23.40 |
| 25.79 | 23.93 |
| 26.20 | 25.93 |
| 27.30 | 23.99 |
| 22.97 | 24.00 |
| 24.52 | 23.62 |
| 21.92 | 23.57 |
| 34.89 | 23.97 |
| 42.54 | 22.44 |
| 42.36 | 24.38 |
| 36.22 | 22.69 |
| 42.72 | 22.52 |
| 42.60 | 23.18 |
| 41.79 | 23.31 |
| 35.93 | 22.95 |
| 41.86 | 22.61 |
| 42.04 | 21.56 |
| 22.83 | 30.74 |
| 24.08 | 31.57 |
| 30.32 | 31.79 |
| 30.35 | 31.30 |
| 30.91 | 29.82 |
| 28.71 | 29.62 |
| 25.64 | 30.44 |
| 25.48 | 30.16 |
| 22.95 | 31.46 |
| 22.63 | 31.41 |
| 38.49 | 30.02 |
| 39.31 | 30.60 |
| 41.25 | 31.79 |
| 40.25 | 30.36 |
| 41.45 | 31.70 |
| 40.42 | 31.44 |
| 41.34 | 31.09 |
| 40.49 | 31.27 |
| 42.43 | 30.58 |
| 41.70 | 30.22 |

METHOD AND SYSTEM FOR ASCERTAINING ANOMALIES IN ELECTRIC MOTORS

CROSS-REFERENCE TO RELATED APPLICATION

This is a continuation of Ser. No. 08/674,645 filed Jun. 28, 1996, now abandoned.

Electric motors are used in very large numbers in many phases of industry. Unexpected electric motor failure is a highly undesirable occurrence since it may result in a host of unwanted and sometimes unacceptable possibilities, including inconvenience, disruption of industrial operations, product loss, safety problems and the like.

The present application discloses subject matter closely related to the subject matter of patent application Ser. No. 08/269466 entitled A NEURAL NETWORK AUTO-ASSOCIATOR AND METHOD FOR INDUCTION MOTOR MONITORING, filed in the names of Thomas Petsche et al. on Jun. 30, 1994 now U.S. Pat. No. 5,576,632, and of patent application Ser. No. 08/269465 entitled A RADIAL BASIS FUNCTION NEURAL NETWORK AUTO-ASSOCIATOR AND METHOD FOR INDUCTION MOTOR MONITORING, filed in the names of Thomas Petsche et al. on Jun. 30, 1994 now U.S. Pat. No. 5,574,387, and whereof the disclosures are herein incorporated by reference.

Induction motors are particularly desirable in many industrial applications because of a number of advantages, including no need of a commutator, a simple construction, generally suitable torque characteristics, essentially constant speed, and low electrical and acoustic noise.

Generally, in industrial settings today, induction motor health is either unmonitored until a problem develops, or monitored on a random basis by simply having a mechanic listen to the motor for the presence of excessive or unusual noise.

Among the disadvantages of present motor-health-monitoring methods are that they rely on human judgement and therefore tend to be subjective, and that if and when a problem is detected it may already be too late to avert unscheduled downtime for maintenance or replacement.

Accordingly, it is desirable that incipient problems with a motor be detected in the developing stage before they cause failure in operation with undesirable consequences. It is also desirable that any monitoring for nascent failure modes be done with a minimum of interference with the motor's operation and a low cost, particularly since the cost of industrial induction motors is relatively low in what is a competitive market.

It is known that the waveform of the supply current to an induction motor exhibits components which contain information on the operation of the motor and the nature of its useful load, including data possibly indicative of anomalous operation, such as an incipient fault or problem. It is an object of the present invention to derive useful prediction information from data samples obtained from the motor supply current waveform. The details of obtaining such samples are described in the present specification, more detail on this known aspect and on the background of the invention is obtainable from the above-identified patent applications of Petsche.

An object of the present invention is to classify data samples, which are representative of an induction motor's health as coming from either a healthy motor or an unhealthy motor. This function is to be performed with the motor on-line in an industrial setting such that the output of the anomaly detector may be used as a guide to maintenance personnel.

Another object of the invention is to solve the problem of dealing with the uncertainty of induction motor failure and the difficulty associated with unscheduled downtime for motor maintenance or replacement.

It is yet another object of the invention to provide the benefit of an early warning system for motor failure so as to alert maintenance personnel that an induction motor is starting to develop a problem, thereby providing a grace period within which maintenance may be scheduled in a more timely fashion.

Work on induction motor condition monitoring using frequency domain analysis is well documented in, for example, P. J. Tavner and J. Penman, "Condition Monitoring of Electrical Machines", Research Studies Press Ltd., Letchworth, Hetfordshire, England, 1987; I. Morito and H. Okitsu, "Signature frequency analysis for diagnosis of induction motor systems", Electrical Engineering in Japan, 109(4), 1989; and G. B. Kliman and J. Stein, "Induction motor fault detection via passive current monitoring", In International Conference on Electrical Machines, Aug. 1990, and research has been carried out in this area. Similarly, the use of cluster analysis is well known and is extensively documented in, for example, G. J. McLachlan, "The Classification and Mixture Maximum Likelihood Approaches to Cluster Analysis", Chapter o, pp. 199–208, North-Holland Publishing Company, 1982; D. Anderson, M. Aitkin and J. Hinde, "Statistical modelling of data on teaching styles", In Journal of Royal Statistical Society, pp. 419–461, 1981; and J. Zupan, "Clustering of Large Data Sets", Research Studies Press, Chichester, 1982.

In accordance with the invention, a clustering program takes as input a set of vectors comprising selected frequency component values obtained by taking a Fast Fourier Transform (FFT) of the current flowing in one of the three stator windings of an induction motor. The hierarchical-agglomerative method used, finds the vector assignments for all possible groupings from 1 to n, where n is the number of p-dimensional input vectors, using a distance metric which maximizes the sum of squared Euclidean distances between separate cluster centroids. See, for example, L. Kaufman and P. J. Rousseeuw, "Findings Groups In Data, An Introduction to Cluster Analysis", Chapter #5, Wiley-Interscience, 1990, pp. 230–234; and H. C. Romesburg, "Cluster Analysis for Researchers", Chapter #9.4, pp. 129–135, Robert E. Krieger, 1990.

The number of clusters, is determined using an iterative procedure called the approximate weight of evidence (AWE), a Bayesian approach that uses the log likelihoods to estimate the probability for the number of clusters. See, for example, J. D. Banfield and A. E. Raftery, "Model-based gaussian and non-gaussian clustering", Biometrics, 1992. Once this initial representative sample of healthy motor data is grouped, new data vectors are tested by measuring their distance from the centroid of each healthy motor data cluster. If a new data point falls within any healthy data p-dimensional spheroid, whose radius is determined by the point farthest from the clusters centroid, that data is not considered novel, and therefore is labelled as coming from a healthy motor. If however, the new data point falls outside of every healthy motor data cluster, it is considered novel, and therefore indicative of a motor problem.

In accordance with an aspect of the invention, frequency domain analysis is combined with clustering and the approximate weight of evidence. These techniques are applied to detecting induction motor anomalies through the use of novelty detection.

In accordance with another aspect of the invention, the approximate weight of evidence is utilized to identify the various operational modes, or loads, of the induction motor.

The method in accordance with the invention, utilizes the healthy motor clusters found using the approximate weight of evidence as baseline, un-novel regions, such that anything outside of these regions is considered novel and therefore indicative of a potential problem with the motor.

The method in accordance with the invention determines induction motor health through the use of novelty detection using only healthy motor data without prior knowledge of the failure modes or actual data samples of unhealthy induction motors.

The method in accordance with the invention uses a Euclidian distance metric on feature vectors comprising FFT frequency values obtained from one phase of an induction motor's supply current, as a measure of the similarity, or dissimilarity, between the feature vectors.

In accordance with another aspect of the invention, a computer-based method for ascertaining anomalies in an electric motor, comprises the steps of (a) obtaining a set of samples of supply current for a motor known to be in a normal condition; (b) computing and processing a set of Fast Fourier Transforms (FFT's) based on waveforms of the supply current for the motor known to be in a normal condition so as to create a feature set of input vectors; (c) calculating all possible input vector assignments for cluster grouping 1 through n using Ward's method, where n is the number of p-dimensional input vectors; (d) computing the Approximate Weight of Evidence (AWE) for the cluster grouping 1 through n; (e) selecting that grouping associated with a maximum AWE and designating the number of clusters in the grouping as s; (f) for each cluster 1 through s, finding the member vector farthest from the cluster's centroid and defining this as the cluster's radius; (g) reading in a single input sample for a motor under supervision; (h) computing and processing an FFT based on the input sample for a newly generated feature vector; and (i) checking whether the newly generated feature vector is inside any of the clusters 1 through s as defined for each cluster by the radius; and (j) if not, outputting a warning signal.

In accordance with still another aspect of the invention, a computer-based method for ascertaining anomalies in an electric motor, comprises the steps of training a system utilizing a set of Fast Fourier Transforms (FFT's) of samples of supply current for a motor known to be in a normal condition so as to form a number s of clusters of input vector assignments, where s is a cluster count having a maximum Approximate Weight of Evidence (AWE); for each cluster 1 through s, finding the member vector farthest from the cluster's centroid and identifying this as the cluster's radius; reading in a single input sample for a motor under supervision; computing and processing an FFT based on the input sample for a newly generated feature vector; and checking whether the newly generated feature vector is inside any of the clusters 1 through s as defined by the radius; and if not, then outputting a warning signal.

In accordance with yet another aspect of the invention, a computer-based system for ascertaining anomalies in an electric motor, comprises apparatus for sampling current flowing in a winding of a motor known to be not defective; apparatus for deriving from the current a set of input vectors comprising selected frequency component values obtained by taking a Fast Fourier Transform (FFT) of the current; apparatus for processing the set of vectors in accordance with Ward's clustering method for finding vector assignments for all possible cluster grouping from 1 to n, where n is the number of the input vectors; apparatus for selecting a number s of cluster grouping out of the all possible clusters by using an iterative procedure of Approximate Weight of Evidence (AWE); apparatus for assigning an effective radius for each of the s clusters, the radius being determined by the farthest member of each of the s clusters from the respective centroid of that cluster; and apparatus for testing a new data vector from a motor to be monitored and for labelling the data vector as indicative of a motor problem if the data vector falls outside of the effective radius of every one of the s clusters.

In accordance with the invention, a computer-based method ascertains anomalies in an electrical device in accordance with any of the foregoing descriptions, where the device tends to exhibit supply current characteristics indicative of anomalous performance or condition.

In accordance with still yet another aspect of the invention, a computer-based method for ascertaining anomalies in an electric motor, comprises a trained system utilizing a set of Fast Fourier Transforms (FFT's) of samples of supply current for a motor known to be in a normal condition so as to form a number s of clusters of input vector assignments, where s is a cluster count having a maximum Approximate Weight of Evidence (AWE); for each cluster 1 through s, apparatus for finding the member vector farthest from the cluster's centroid and identifying this as the cluster's radius; apparatus for reading in a single input sample for a motor under supervision; apparatus for computing and processing an FFT based on the input sample for newly generating a feature vector; and apparatus for checking whether the newly generated feature vector is inside any of the clusters 1 through s as defined by the radius and if not, for then outputting a warning signal.

The invention will be still better understood from the following detailed description of preferred embodiments in conjunction with the Drawing, in which FIG. 1 shows a flow diagram of the method in accordance with the invention;

FIG. 3 shows an example of clustering results obtained in accordance with the invention based on actual induction motor data;

FIG. 4 shows a data set including 40 2-dimensional input vectors;

In addition to the figures, Appendix 1 provides an outline description of the Approximate Weight of Evidence (AWE) method (known per se) as utilized in the described preferred embodiment of the present invention.

Figure 1:
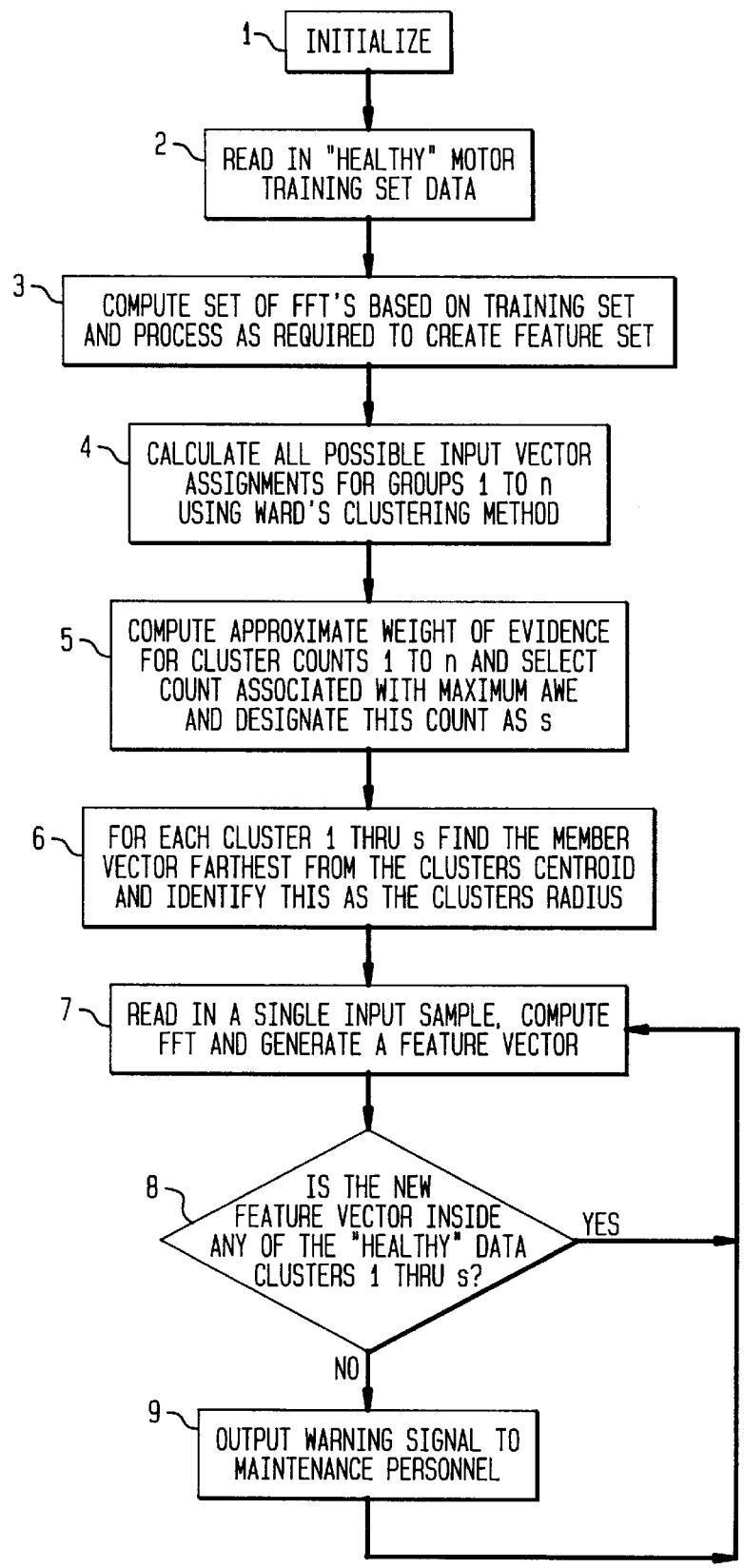

In accordance with FIG. 1, the upper six boxes of the flow diagram outline the steps involved in finding the healthy motor groups, computing the approximate weight of evidence, and calculating the size of each healthy motor cluster. These steps comprise the training phase.

These steps comprise initializing (Step 1), reading in "healthy" motor training set data (Step 2), computing a set of Fast Fourier Transforms (FFT's) based on training set data which is then processed as required to create a feature set (Step 3). The process then continues with the step of calculating all possible input vector assignments for cluster groupings 1 to n using Ward's clustering method (Step 4), computing the Approximate Weight of Evidence (AWE) for cluster groupings 1 through n and selecting the groupings associated with a maximum AWE and designating this grouping as s (Step 5). The "dendritic" progress of the clustering process is therefore truncated at the level s, this being the optimal choice under the criteria of the AWE algorithm used. The process continues with the step of, for each cluster 1 through s, finding the member vector farthest from the cluster's centroid and identifying this as the cluster's radius (Step 6).

Once the healthy motor clusters are constructed, the procedure enters the on-line monitoring phase as outlined by the steps in the three lower boxes of the flow diagram.

As shown in FIG. 1, these steps comprise reading in a single input sample, computing the FFT, and generating a feature vector (Step 7), checking whether the newly generated feature vector is inside any of the healthy data clusters (Step 8), and outputting a warning signal to personnel maintenance (Step 9). If the answer in step 8 is affirmative, the system returns to step 7; otherwise, the process continues through step 8. When step 9 outputs the warning signal, the system returns to step 7 and continues.

Accordingly, in this phase, as set forth above, input samples of induction motor stator current are processed to create feature vectors one-at-a-time. The Euclidian distance between the feature vector and each healthy motor cluster centroid is then calculated. This is where novelty detection is used. If the feature vector falls within any healthy motor cluster, the procedure simply loops around to read the next input sample. If however, the feature vector does not fall within any of the healthy motor clusters, it is considered novel since it is outside of the healthy groups, and a signal is outputted to alert maintenance personnel.

Figure 2:
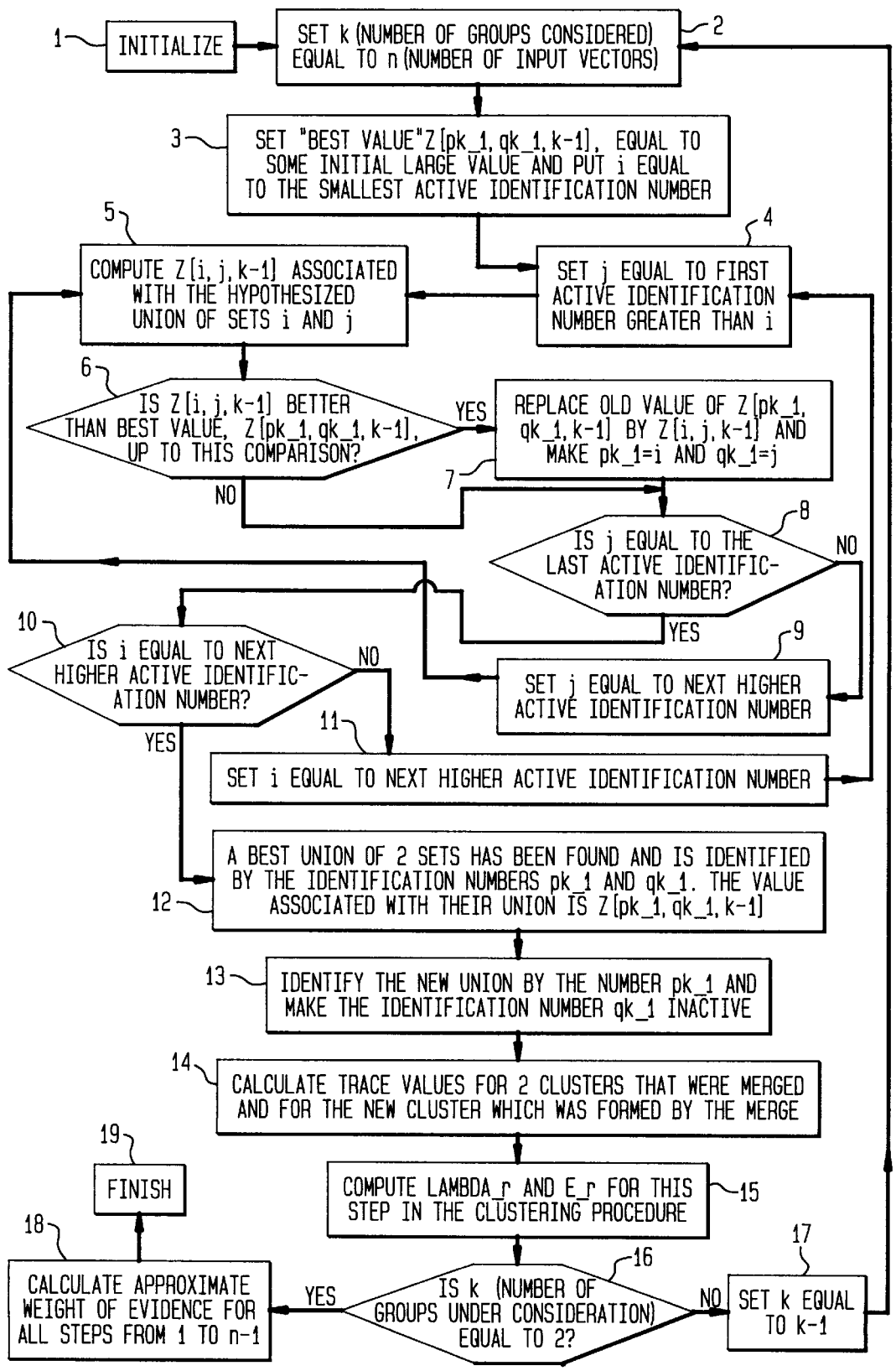
FIG. 2 shows details of the clustering procedure (known per se) utilized in the invention.

Details of the actual clustering procedure used in the present exemplary embodiment are shown in the diagram in FIG. 2. Reference is made to the cited literature relating to Ward's Clustering Algorithm, herein incorporated by reference and to Appendix 1, Approximate Weight of Evidence for the definition of symbols used herein. It is understood that neither Ward's clustering algorithm nor the Approximate Weight of Evidence Rule also utilized herein is per se novel.

In FIG. 2, the steps comprise: following an initializing Step 1, setting k (the number of groups considered) equal to n (the number of input vectors) (Step 2), setting the "best value" $Z[pk\_1, qk\_1, k-1]$ equal to some initial large value and putting i equal to the smallest active identification number (Step 3), setting j equal to the first active identification number greater than i (Step 4), computing $Z[i,j,k-1]$ associated with the hypothesized union of sets i and j (Step 5), determining whether $Z[i,j,k-1]$ is better than the best value $Z[pk\_1, qk\_1, k-1]$ up to this comparison (Step 6); if the answer is yes, this is followed by Step 7, replacing the old value of $Z[pk\_1, qk\_1, k-1]$ by $Z[i,j,k-1]$ and making $pk\_1=i$ and $qk\_1=j$ and proceeding to Step 8; if the answer is no, this is followed by Step 8, ascertaining whether j is equal to the last active identification number (Step 8); if the answer is no, then set j equal to the next higher active identification number (Step 9), and return to Step 5; if the answer is yes, proceed to Step 10 to determine whether i is equal to the next higher active identification number; if not, set i equal to the next higher active identification number (Step 11) and return to Step 4; if yes, proceed to Step 12 wherein a best union of 2 sets has been found and is identified by the identification numbers $pk\_1$ and $qk\_1$, the value associated with their union being $Z[pk\_1, qk\_1, k-1]$, then to Step 13 to identify the new union by the number $pk\_1$ and make the identification number $qk\_1$ inactive, then calculate trace values for 2 clusters that were merged and for the new cluster which was formed by the merge (Step 14), then compute lambda_r and E_r for this step in the clustering procedure (Step 15), then determine whether k (the number of groups under consideration) is equal to 2 (Step 16); if not, set k equal to k-1 (Step 17) and return to step 2; if the answer is yes, proceed to calculate the approximate weight of evidence for all steps from 1 to n-1 (Step 18), and so arrive at the Finish, (Step 19).

FIG. 3 presents an example of clustering results based on actual induction motor data. In this example 10 clusters were suggested by the AWE. In FIG. 3, each of the lines labelled 1–10 represents a cluster formed of the cluster members on that line. The test conditions are set forth in the test conditions at the top of FIG. 3. Thus, inputs are for a balanced motor, with 10 FFT's per load condition. Each FFT is an average of 12 "raw" FFT's. 42 input features are used in the range of 0 Hz–58.59 Hz, each feature being an average of 3 frequencies spanning 1.4036 Hz.

The numbered clusters correspond respectively to the 10 loads the induction motor was driving while the data was being gathered, as listed in the test conditions in FIG. 3. Thus vectors 1–10 correspond to a load condition of ½ the rated constant load for the motor, vectors 21–30 correspond to a rated load condition varying sinusoidally, vectors 91–100 correspond to the rated load intermittently applied in square wave fashion at a rate of 30 Hz, and so forth for the other vectors, as indicated.

Information on the motor testing facility employed to collect the data, as well as general background information on induction motor monitoring is provided in Appendix 2.

FIG. 4 lists a 40×2 data set, different from the data in FIG. 3. Each of the 40 vectors comprises the decibel value at 2 separate frequencies provided by the FFT. These frequencies were found to be useful in distinguishing induction motor faults for this particular set of data. In this experiment the clustering program was trained on all 40 input vectors in order to determine the effectiveness of the 2 frequencies in separating the fault groups.

Figure 5:
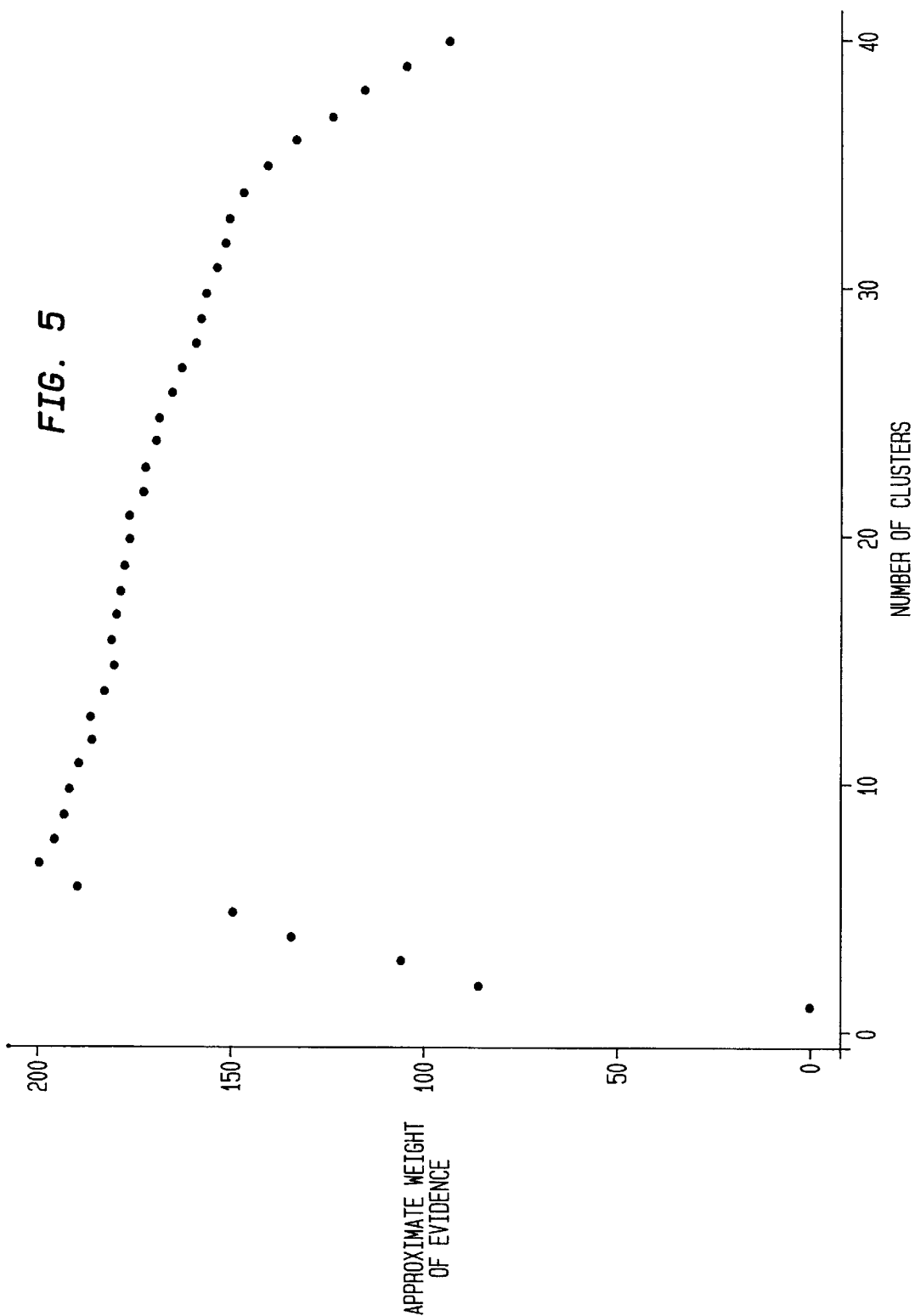
FIG. 5 shows a plot of the approximate weight of evidence calculated for the data shown in FIG. 4.

FIG. 5 plots the approximate weight of evidence calculated for the data of FIG. 4. It is apparent that a broad peak occurs at around 7 clusters. Naturally, other clustering criteria may be utilized. The number of clusters is necessarily a compromise between on the one hand the similarity of members of a cluster, which is desirably maximized, and on the other hand, the dissimilarity or distinctness of the clusters themselves which is also desirably maximized.

Figure 6:
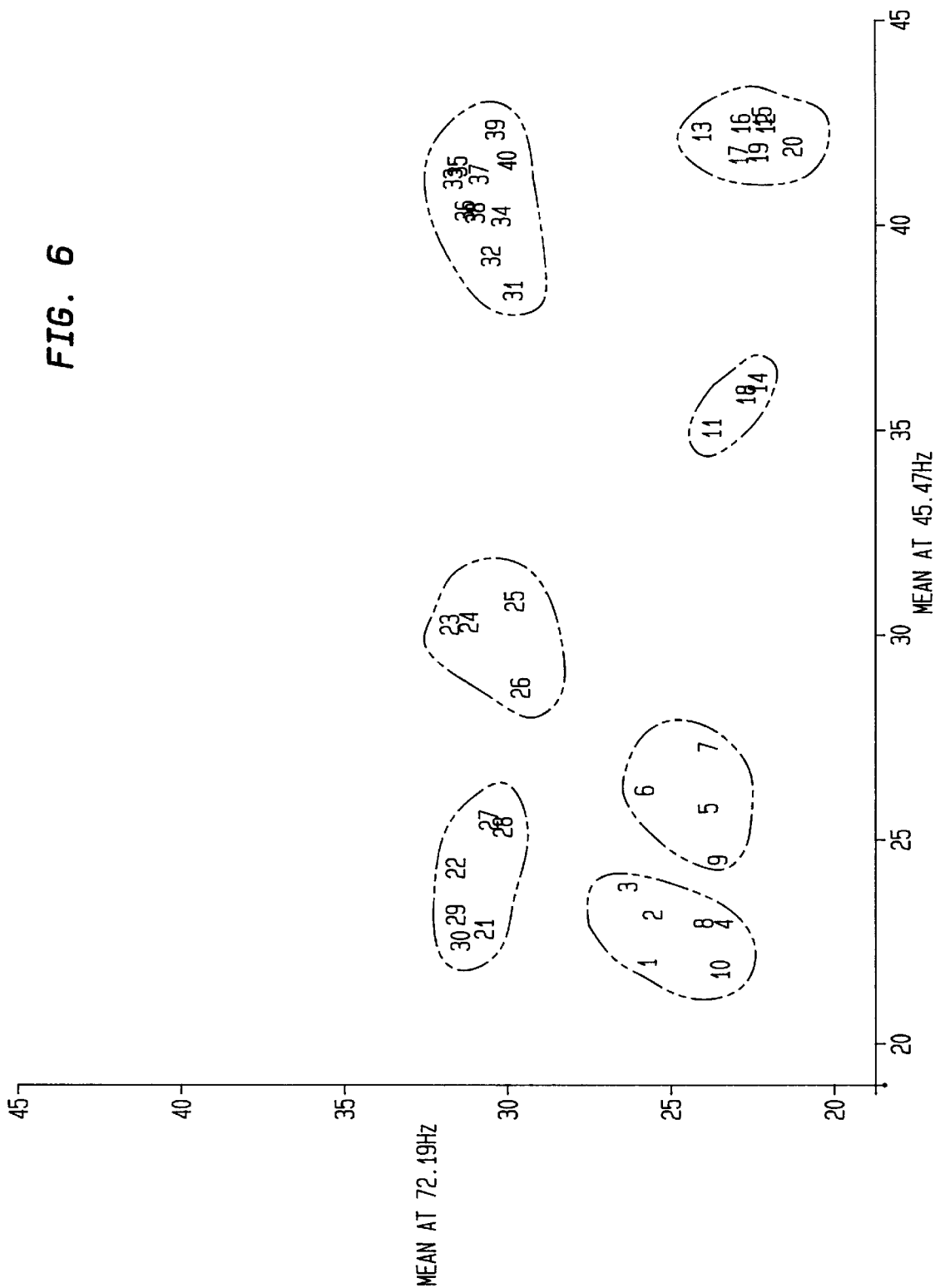
FIG. 6 is a plot of cluster assignments.

FIG. 6 is a plot of the cluster assignments corresponding to this data.

Figure 7:
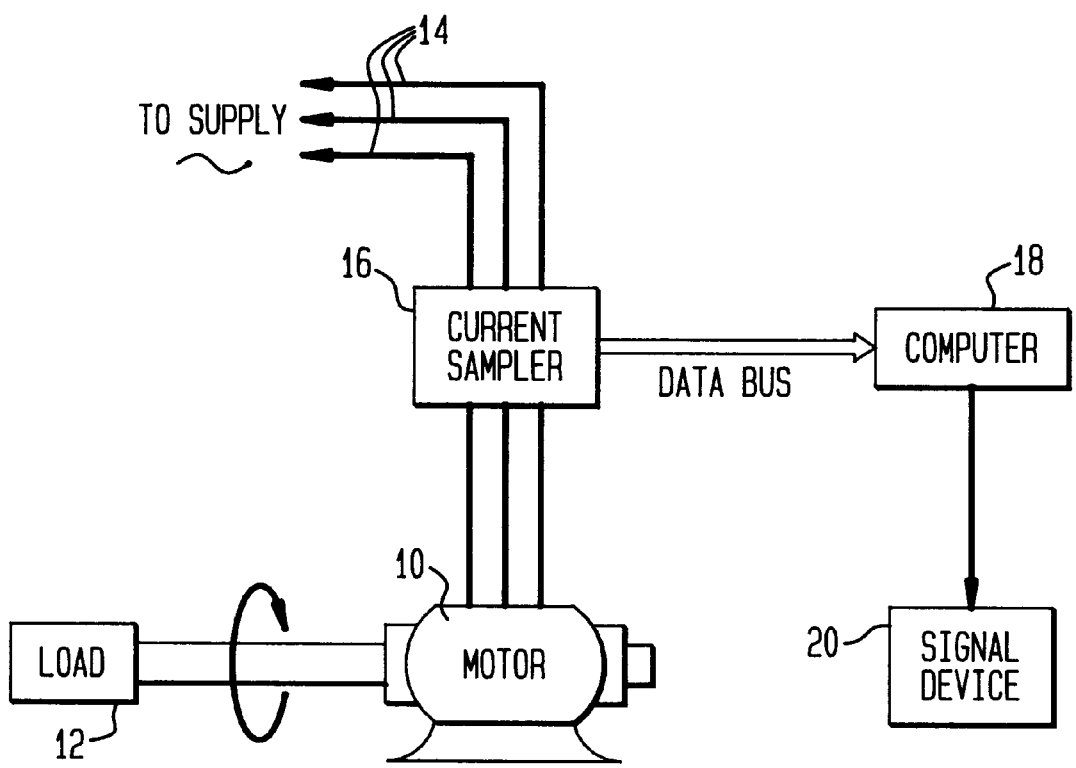
FIG. 7 shows a system in accordance with the invention in block diagrammatic form.

FIG. 7 shows a system in accordance with the invention in block diagrammatic form. An induction motor 10 drives a load device 12 which, for the purposes of developing data, may be programmable and variable. The power supply leads 14 to motor 10 pass through a current sampling device 16, from which digital information on current samples is supplied to a programmed computer 18. Computer 18 is also coupled to a warning or signalling device 20.

While the invention has been described by way of an exemplary embodiment, it will be understood by one of skill in the art to which it pertains that various changes and modifications can be made without departing from the spirit of the invention. It will also be understood that, while the exemplary application described is directed to motors, the invention is just as well applicable to other electrical devices from which an electrical signal is obtainable which exhibits information useful in detecting anomalous performance or conditions. The electrical signal may be from the supply current but need not be. It may be a representative current or voltage anywhere in the device.

Thus, for example, a different clustering algorithm, other than Ward's can be utilized. Furthermore, a different rule can be used from the Approximate Weight of Evidence herein applied. The width of spectral windows, the spectral averaging technique, and the Euclidean distance criterion are all susceptible of replacement by other convenient alternatives.

The exemplary implementation herein disclosed is not intended to be limiting of the invention, which is defined by the claims following.

Approximate Weight of Evidence

Ward's clustering algorithm is a hierarchical-agglomerative method which provides the input observation, or input vector, assignments for all possible groupings from 1 to n where n is the total number of observations. Some way is required therefore, to act as a guide in choosing the number of clusters, or groups. One approach is to use the approximate weight of evidence (AWE) which uses the log likelihoods to estimate the probability for the number of clusters being s, where s is between 1 and n.

The AWE uses the covariance, or cross-product, matrix:

$$W_k = \Sigma_{i \in C_k}(x_i - \hat{x}_k)(x_i - \hat{x}_k)^T$$

and focuses on the variances tr $(W_k)$

The AWE is a function of the likelihood:

$$L = c - 0.5\, np(\log(tr(W)) + (1 - \log(np)))$$

where c is a constant, n is the number of observations and p is the number of parameters Trace of W is defined as:

$$tr(W) = \sum_{k=1}^{s} tr(W_k)$$

s is the number of clusters

The AWE can be calculated as follows.

If clusters i and j are merged at step r, the value of the likelihood at step r+1 is given by:

$$L_{r+1} = L_r + tr(W_{ij}) - (tr(W_i) + tr(W_j))$$

The difference in log likelihoods is:

$$\lambda_r = np(\log(L_{r+1}) - \log(L_r))$$

In going from step r to step r+1, the change in the approximate weight of evidence is:

$$E_r = \lambda_r - \left[\frac{3}{2} + \log(pn_{r,r+1})\right] 2\sigma_r$$

where $n_{r,r+1}$ is the number of observations in the merged cluster, and $\sigma_r$ the number of parameters the approximate weight of evidence for s clusters is:

$$F_s = \sum_{t=1}^{s-1} E_t$$

We choose the number of clusters that maximizes $F_s$ $$s^* = \arg\max_s F_s$$

We claim:

1. A computer-based method for ascertaining anomalies in an electric motor, comprising the steps of:

(a) obtaining a set of samples of supply current for a motor known to be in a normal condition;

(b) computing and processing a set of Fast Fourier Transforms (FFT's) based on waveforms of said supply current for said motor known to be in a normal condition so as to create a feature set of input vectors;

(c) calculating all possible input vector assignments for clusters 1 through n using Ward's method, where n is the number of p-dimensional input vectors, in accordance with the following steps:

Step 1: initializing,

Step 2: setting k, the number of groups considered, equal to n, the number of input vectors, Step 3: setting the "best value" $Z[pk_{13}\,1, qk\_1, k-1]$ equal to some initial large value and putting i equal to the smallest active identification number, Step 4: setting j equal to the first active identification number greater than i, Step 5: computing $Z[i,j,k-1]$ associated with the hypothesized union of sets i and j, Step 6: determining whether $Z[i,j,k-1]$ is better than the best value $Z[pk\_1, qk\_1, k-1]$ up to this comparison; if the answer yes, this is followed by Step 7, replacing the old value of $Z[pk\_1, qk\_1, k-1]$ by $Z[i,j,k-1]$ and making pk\_1=i and qk\_1=j and proceeding to Step 8; if the answer is no, this is followed by Step 8, ascertaining whether j is equal to the last active identification number; if the answer is no, then Step 9, set j equal to the next higher active identification number, and return to Step 5; if the answer is yes, proceed to Step 10, determine whether i is egual to the next higher active identification number; if not proceed to Step 11; if yes, proceed to Step 12, Step 11, set i equal to the next higher active identification number (Step 11) and return to Step 4;

Step 12, find a best union of 2 sets and identify it by the identification numbers pk\_1 and qk\_1, the value associated with their union being $Z[pk\_1, qk\_1, k-i]$, then to Step 13, identify the new union by the number pk\_1 and make the identification number qk\_1 inactive, Step 14, calculate trace values for 2 clusters that were merged and for the new cluster which was formed by the merge, Step 15, compute lambda\_r and E\_r for this step in the clustering procedure, Step 16, determine whether k, the number of groups under consideration, is equal to 2; if not, proceed to Step 17; if the answer is yes, proceed to Step 18, Step 17, set k equal to k−1 (Step 17) and return to step 2;

Step 18, calculate the approximate weight of evidence for all steps from 1 to n−1;

(d) computing the Approximate Weight of Evidence (AWE) for said cluster counts 1 through n;

(e) selecting that count associated with a maximum AWE and designating this count as s;

(f) for each cluster 1 through s, finding the member vector farthest from the cluster's centroid and defining this as the cluster's radius;

(g) reading in a single input sample for a motor under supervision;

(h) computing and processing an FFT based on said input sample for newly generating a feature vector; and (i) checking whether said newly generated feature vector is inside any of said clusters 1 through s as defined for each cluster by said radius; and (j) if not, outputting a warning signal.

2. A computer-based method for ascertaining anomalies in an electric motor, comprising the steps of:

(a) sampling current flowing in a winding of a motor known to be not defective;

(b) deriving from said current a set of input vectors comprising selected frequency component values obtained by taking a Fast Fourier Transform (FFT) of said current;

(c) processing said set of vectors in accordance with a clustering program for finding vector assignments for all possible clusters from 1 to n, where n is the number of said input vectors;

(d) selecting a number s of clusters out of said all possible clusters in accordance with a Bayesian approach that uses the log likelihoods to estimate the probability for the number of clusters;

(e) assigning an effective cross-section for each of said clusters;

(f) testing a new data vector from a motor to be monitored;

(g) if said data vector falls within said effective cross-section of any of said s clusters, then labelling said data vector as not indicative of a motor problem; and (h) if said data vector falls outside of said effective cross-section of every one of said s clusters, then labelling said data vector as indicative of a motor problem.

3. A computer-based method for ascertaining anomalies in an electric motor as recited in claim 2, wherein step (c) comprises using a distance metric which maximizes the sum of squared Euclidean distances between separate cluster centroids.

4. A computer-based method for ascertaining anomalies in an electric motor as recited in claim 3, wherein step (c) comprises using Ward's clustering method.

5. A computer-based method for ascertaining anomalies in an electric motor as recited in claim 4, wherein step (c) comprises an iterative procedure called the Approximate Weight of Evidence (AWE).

6. A computer-based method for ascertaining anomalies in an electric motor as recited in claim 5, wherein step (e) comprises assigning an effective radius for each of said s clusters, said radius being determined by the farthest member of each of said s clusters from the respective centroid of that cluster.

7. A computer-based method for ascertaining anomalies in an electric motor, comprising the steps of:

(a) sampling current flowing in a winding of a motor known to be not defective;

(b) deriving from said current a set of input vectors comprising selected frequency component values obtained by taking a Fast Fourier Transform (FFT) of said current;

(c) processing said set of vectors in accordance with Ward's clustering method for finding vector assignments for all possible clusters from 1 to n, where n is the number of said input vectors, in accordance with the following steps:

Step 1: initializing,

Step 2: setting k, the number of groups considered, equal to n, the number of input vectors, Step 3: setting the "best value" $Z[pk\_1, qk\_1, k-1]$ equal to some initial large value and putting i equal to the smallest active identification number, Step 4: setting j equal to the first active identification number greater than i, Step 5: computing $Z[i,j,k-1]$ associated with the hypothesized union of sets i and j, Step 6: determining whether $Z[i,j,k-1]$ is better than the best value $Z[pk\_1, qk\_1, k-1]$ up to this comparison; if the answer is yes, this is followed by Step 7, replacing the old value of $Z[pk\_1, qk\_1, k-1]$ by $Z[i,j,k-1]$ and making pk 1=i and qk 1=j and proceeding to Step 8; if the answer is no, this is followed by Step 8, ascertaining whether j is equal to the last active identification number; if the answer is no, then Step 9, set j equal to the next higher active identification number, and return to Step 5; if the answer is yes, proceed to Step 10, determine whether i is equal to the next higher active identification number; if not proceed to Step 11; if yes, proceed to Step 12, Step 11, set i equal to the next higher active identification number (Step 11) and return to Step 4;

Step 12, find a best union of 2 sets and identify it by the identification numbers pk_1 and qk_1, the value associated with their union being $Z[pk\_1, qk\_1, k-1]$, then to Step 13, identify the new union by the number pk_1 and make the identification number qk_1 inactive, Step 14, calculate trace values for 2 clusters that were merged and for the new cluster which was formed by the merge, Step 15, compute lambda_r and E_r for this step in the clustering procedure, Step 16, determine whether k, the number of groups under consideration, is equal to 2; if not, proceed to step 17; if the answer is yes, proceed to Step 18, Step 17, set k equal to k−1 (Step 17) and return to step 2;

Step 18, calculate the approximate weight of evidence for all steps from 1 to n−1;

(d) selecting a number s of clusters out of said all possible clusters by using an iterative procedure of Approximate Weight of Evidence (AWE);

(e) assigning an effective radius for each of said s clusters, said radius being determined by the farthest member of each of said s clusters from the respective centroid of that cluster;

(f) testing a new data vector from a motor to be monitored;

(g) if said data vector falls within said effective radius of any of said s clusters, then labelling said data vector as not indicative of a motor problem; and (h) if said data vector falls outside of said effective radius of every one of said s clusters, then labelling said data vector as indicative of a motor problem.

8. A computer-based method for ascertaining anomalies in an electric motor, comprising the steps of:

training a system utilizing a set of Fast Fourier Transforms (FFT's) of samples of supply current for a motor known to be in a normal condition so as to form a number s of clusters of input vector assignments, where s is a cluster count having a maximum Approximate Weight of Evidence (AWE)

for each cluster 1 through s, finding the member vector farthest from the cluster's centroid and identifying this as the cluster's radius;

reading in a single input sample for a motor under supervision;

computing and processing an FFT based on said input sample for newly generating a feature vector;

checking whether said newly generated feature vector is inside any of said clusters 1 through s as defined by said radius; and if not, then outputting a warning signal.

9. A computer-based system for ascertaining anomalies in an electric motor, comprising:

means for sampling current flowing in a winding of a motor known to be not defective;

means for deriving from said current a set of input vectors comprising selected frequency component values obtained by taking a Fast Fourier Transform (FFT) of said current;

means for processing said set of vectors in accordance with a clustering program for finding vector assignments for all possible clusters from 1 to n, where n is the number of said input vectors, means for selecting a number s of clusters out of said all possible clusters in accordance with a Bayesian approach that uses the log likelihoods to estimate the probability for the number of clusters;

means for assigning an effective cross-section for each of said clusters; and means for testing a new data vector from a motor to be monitored and for labelling said data vector as indicative of a motor problem if said data vector falls outside of said effective cross-section of every one of said s clusters.

10. A computer-based system for ascertaining anomalies in an electric motor, comprising:

means for sampling current flowing in a winding of a motor known to be not defective;

means for deriving from said current a set of input vectors comprising selected frequency component values obtained by taking a Fast Fourier Transform (FFT) of said current;

means for processing said set of vectors in accordance with Ward's clustering method for finding vector assignments for all possible clusters from 1 to n, where n is the number of said input vectors;

means for selecting a number s of clusters out of said all possible clusters by using an iterative procedure of Approximate Weight of Evidence (AWE);

means for assigning an effective radius for each of said s clusters, said radius being determined by the farthest member of each of said s clusters from the respective centroid of that cluster; and means for testing a new data vector from a motor to be monitored and for labelling said data vector as indicative of a motor problem if said data vector falls outside of said effective radius of every one of said s clusters.

11. A computer-based method for ascertaining anomalies in an electric motor, comprising: a trained system utilizing a set of Fast Fourier Transforms (FFT's) of samples of supply current for a motor known to be in a normal condition so as to form a number s of clusters of input vector assignments, where s is a cluster count having a maximum Approximate Weight of Evidence (AWE);

for each cluster 1 through s, means for finding the member vector farthest from the cluster's centroid and identifying this as the cluster's radius;

means for reading in a single input sample for a motor under supervision;

means for computing and processing an FFT based on said input sample for a newly generated feature vector; and means for checking whether said newly generated feature vector is inside any of said clusters 1 through s as defined by said radius and if not, for then outputting a warning signal.

12. A computer-based method for ascertaining anomalies in an electrical device, said device tending to exhibit a representative current having characteristics indicative of anomalous performance or condition, said method comprising the steps of:

(a) obtaining a set of samples of said representative current for a device of the type under consideration known to be in a normal condition;

(b) computing and processing a set of Fast Fourier Transforms (FFT's) based on waveforms of said representative current for said device known to be in a normal condition so as to create a feature set of input vectors;

(c) calculating all possible input vector assignments for clusters 1 through n using Ward's method, where n is the number of p-dimensional input vectors;

(d) computing the Approximate Weight of Evidence (AWE) for said cluster counts 1 through n;

(e) selecting that count associated with a maximum AWE and designating this count as s;

(f) for each cluster 1 through s, finding the member vector farthest from the cluster's centroid and defining this as the cluster's radius;

(g) reading in a single input sample for a device under supervision;

(h) computing and processing an FFT based on said input sample for a newly generating a feature vector; and (i) checking whether said newly generated feature vector is inside any of said clusters 1 through s as defined for each cluster by said radius; and (j) if not, outputting a warning signal.

* * * * *